United States Patent [19]

Vu et al.

[11] Patent Number: 4,713,559
[45] Date of Patent: Dec. 15, 1987

[54] MULTIPLE INPUT AND MULTIPLE OUTPUT OR/AND CIRCUIT

[75] Inventors: Tho T. Vu, Fridley; Kang W. Lee, Wayzata, both of Minn.

[73] Assignee: Honeywell Inc., Minneapolis, Minn.

[21] Appl. No.: 728,066

[22] Filed: Apr. 29, 1985

[51] Int. Cl.$^4$ .................. H03K 19/02; H03K 19/094; H03K 19/084; H03K 19/092

[52] U.S. Cl. .................................... 307/446; 307/450; 307/458; 307/475

[58] Field of Search ............... 307/446, 450, 457–458, 307/443, 475, 296 R

[56] References Cited

U.S. PATENT DOCUMENTS 4,404,480  9/1983  Ransom et al. ..................... 307/457
4,418,292 11/1983  Cserhalmi et al. .................. 307/450

FOREIGN PATENT DOCUMENTS 3539763  9/1963  Australia ............................ 307/457

OTHER PUBLICATIONS

Tho T. Vu, et al. article, a Gallium Arsenide SDFL Gate Array with On-Chip RAM, reprinted from IEEE Journal of Solid-State Circuits, vol. SC-19, No. 1, Feb. 1984.

Primary Examiner—Stanley D. Miller
Assistant Examiner—M. R. Wambach
Attorney, Agent, or Firm—John G. Shudy, Jr.

[57] ABSTRACT

An OR logic function is provided in at least two separate circuit branches by diodes in parallel summing current at a first logic node and a first circuit branch and diodes in parallel summing current at a second logic node in a second current branch. An AND logic function is performed at a third logic node by using additional diodes connected in parallel at the third logic node so as to share current passing through the third logic node, with the logic conditions at the first and second logic nodes serving as the inputs to the AND logic function. The logic condition at the third logic node is applied to the gate of a switching FET. The switching FET is conveniently employed to invert the logic condition at the third logic node. The invention is particularly suited for use with MESFET logic families using gallium arsenide (GaAs) substrates.

18 Claims, 11 Drawing Figures

MULTIPLE INPUT AND MULTIPLE OUTPUT OR/AND CIRCUIT

BACKGROUND OF THE INVENTION

1. Field of the Invention

This invention relates to OR/AND field effect transistor (FET) circuits employing diodes in parallel configurations to perform the logic functions. In particular, the above logic circuits use Schottky diodes and a gallium arsenide (GaAs) substrate.

2. Related Art

FIG. 1 displays Schottky diode FET logic (SDFL) OR/AND invert logic circuit 10. Circuit 10 is published by Vu, et al in a Gallium Arsenide SDFL gate array with on chip RAM, IEEE Journal of Solid State Circuits, Vol. SC 19, No. 1, February 1984. The OR logic function is provided at logic node 14 for inputs A and B, and at logic node 12 for inputs C and D. Diode 16 and 18 provide current summing for inputs A and B as do diodes 20 and 22 for inputs C and D.

Node 24 tracks the voltage at node 12 except that diodes 26 and 27 shift the voltage level. Similarly, node 28 tracks the voltage at node 14 but the level is shifted by diode 30. FETs 31 and 32 serve as pull-down current sources to the respective logic branches.

The AND logic function is provided by the series connection of FETs 34 and 36, with INVERT provided at output node 38. FET 40 is a pull-up current source.

While circuit 10 provides a compact FET OR/NAND gate, it is limited in its fan-in and fan-out capabilities. In particular, the voltage swing between logic state 1 and logic state 0 is reduced relative to a single FET switching gate by the voltage drop across the additional FET 34 in series with FET 36. The smaller voltage swing reduces the noise margin and the fan-out of the circuit. The reduced noise margin also makes the circuit less radiation hard.

SUMMARY OF THE INVENTION

A FET multiple input OR/AND circuit is provided where the AND function is performed by diodes connected in parallel so as to share current from a current source. The OR function is provided by current summing diodes connected in parallel. The output is applied to the gate of a switching FET.

Preferably the diodes are Schottky diodes. The invention is particularly suited for MESFET applications on gallium arsenide substrates. The invention is very useful in implementing logic functions like multiplexing, demultiplexing, encoding, decoding, counting, ALU etc., which require multiple inputs and multiple outputs, due to the invention's parallel AND capabilities and high-fan-out and the flexibility of creating multiple OR/AND logic levels for VLSI implementation.

DESCRIPTION OF THE PREFERRED EMBODIMENT

As used herein, FET refers to all unipolar transistor field effect devices.

Figure 1:
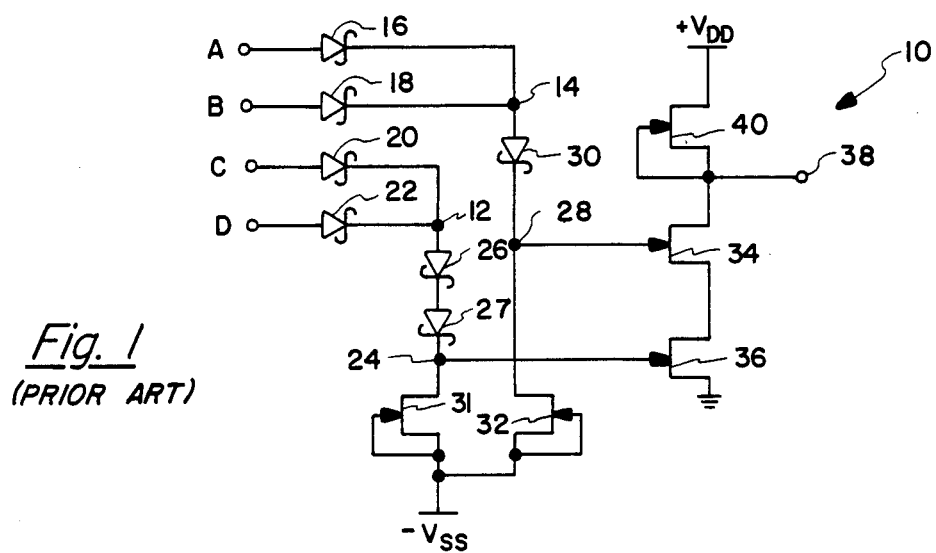
FIG. 1 is a schematic of a prior art OR/NAND FET gate with the AND function provided by FET connected in series.
Figure 2:
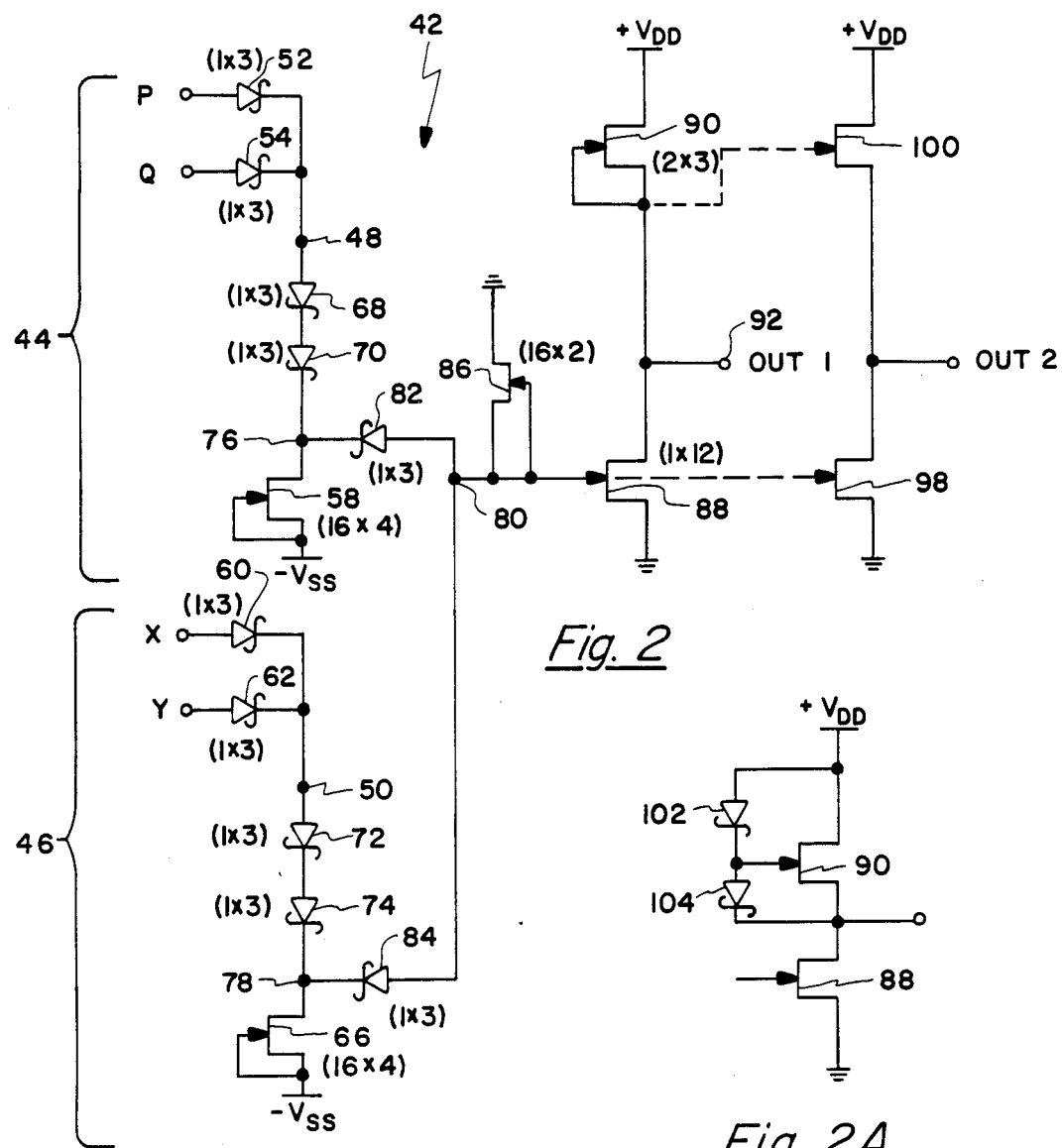
FIG. 2 is a schematic of the present invention configured as SDFL. An optional output gate is also shown.

Circuit 42 of FIG. 2 includes the present invention. Multiple inputs are provided by first and second input branches 44 and 46. First logic node 48 provides a logic OR for inputs P and Q. Second logic node 50 provides a logic OR for inputs X and Y. Diodes (preferably Schottky) 52 and 54 sum current from current source 58 at node 48. That is diodes 52 and 54 have their anodes connected, respectively, to inputs P and Q, and their cathodes connected to node 48. Similarly diodes (again preferably Schottky) 60 and 62 sum current from current source 66 at node 50. Current sources 58 and 66 are preferably FETs with their gate and sources shorted. Voltage level shifting (required if the switching FET 88 is a depletion mode device) is provided in branch 44 by Schottky diodes 68 and 70. Likewise, voltage level shifting is provided in branch 46 by Schottky diodes 72 and 74. Voltage level shifting is not required if the switching FET 88 is an enhancement mode device, but voltage level shifting is still possible and depending on the particular design of the circuit may be employed.

Node 76 tracks the voltage condition of logic node 48 (except for level shifting). Similarly node 78 tracks the voltage condition of node 50.

An AND logic function is provided for the voltage on node 48 (or 76) and node 50 (or 78) at node 80. Diodes (preferably Schottky) 82 and 84 perform this AND function by sharing current from current source 86. That is, diodes 82 and 84 have their anodes connected to node 80 and their cathodes connected, respectively, to logic nodes 76 and 78. The logic condition at node 80 is thus (P+Q)(X+Y). The logic condition at node 80 is then applied to the gate of switching FET 88.

FET 88 is connected in series with a current source (e.g. FET 90). This series combination is connected between a voltage supply $+V_{DD}$ and a voltage reference (e.g., ground). The output can be conveniently taken at the drain of FET 88 (i.e., node 92 or OUT 1) to provide inversion of the logic condition at node 80. The result is an OR/NAND SDFL circuit.

Figure 3:
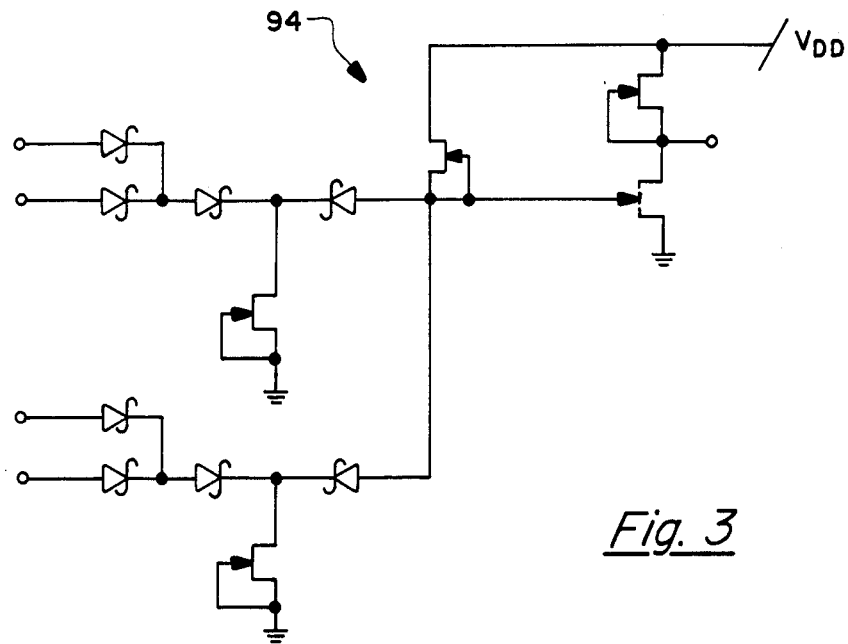
FIG. 3 is a schematic of the present invention wherein depletion and enhancement mode FETs are employed.
Figure 4:
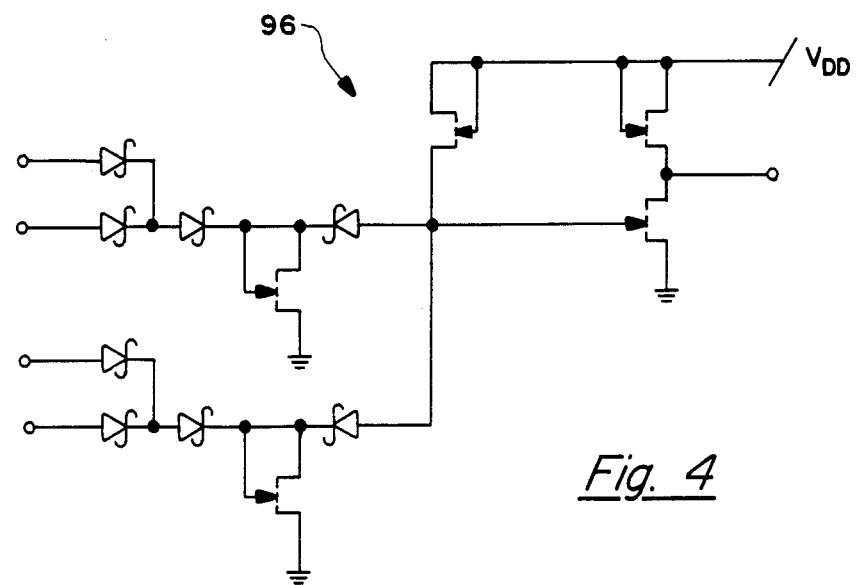
FIG. 4 is a schematic of the present invention wherein only enhancement mode FETs are employed.

The FETs shown in circuit 42 can be depletion devices, enhancement devices or combinations of depletion and enhancement devices. By way of example, FIG. 3 shows a circuit 94 in accordance with the present invention where both depletion and enhancement mode FETs are employed; and FIG. 4 shows a circuit 96 in accordance with the present invention where only enhancement mode FETs are employed.

FET 88 could be a switching FET in other FET logic families than SDFL, for example, buffered FET logic (BFL), source coupled FET logic (SCFL) or direct coupled FET logic (DCFL). When this OR/AND circuit is implemented as in FIGS. 3 and 4, only one power supply ($V_{DD}$) and one ground reference (or $V_{SS}$) are required.

The FETs in circuit 42 are preferably MESFETs, however, other FETs such as JFETS, MISFETs, MOSFETs or MODFETs can be used. The substrate material can be various semiconductor material such as gallium arsenide, indium phosphide or silicon. Further, the logic condition at node 80 need not be inverted.

Additionally, various optional output configurations may be employed. Circuit 42 shows an additional output buffer including FETs 98 and 100. The additional output buffer is commonly referred to as a super or push-pull output buffer and can be employed to increase fan-out. As compared to the prior art circuit 10, circuit 42 will provide increased fan-out. Other forms of lower power or high speed output configurations are easily adapted to the disclosed OR/AND circuit.

Additional circuit branches can be added to circuit 42 just as circuit branch 46 was added to circuit branch 44. These additional branches would form an additional parallel input to the AND function performed at node 80. Thus several multiple inputs could be provided to the AND logic function whereas the prior art circuit 10 is limited to two inputs without the addition of other FETs in series with FETs 34 and 36, which would further reduce the voltage swing between logic levels for circuit 10.

The dimensions in parentheses in FIG. 2 are in microns and show the OR/AND/INVERT circuit along with device sizes for a circuit which has been designed, fabricated and is fully operational.

Figure 2A:
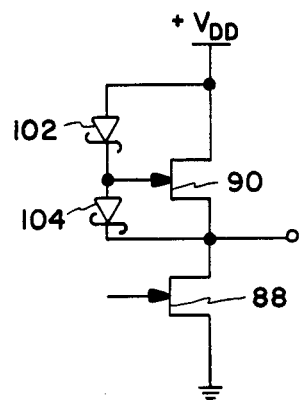
FIG. 2A is a schematic of an optional bootstrap output for the circuit of FIG. 2.

The OR/AND/INVERT circuit 42 of FIG. 2 has also been demonstrated with a bootstrap output for high speed operation in place of the first output stage shown in FIG. 2. This alternative output is shown in FIG. 2A with corresponding features like-numbered between FIGS. 2 and 2A. Note the addition of diodes 102 and 104. The operation of the circuit of FIG. 2A is disclosed in U.S. patent application "Bootstrap Enhancement of MESFET Logic Families", A. Peczalski filed in March, 1985, assigned to the assignee of this application and incorporated herein by reference.

Figure 5:
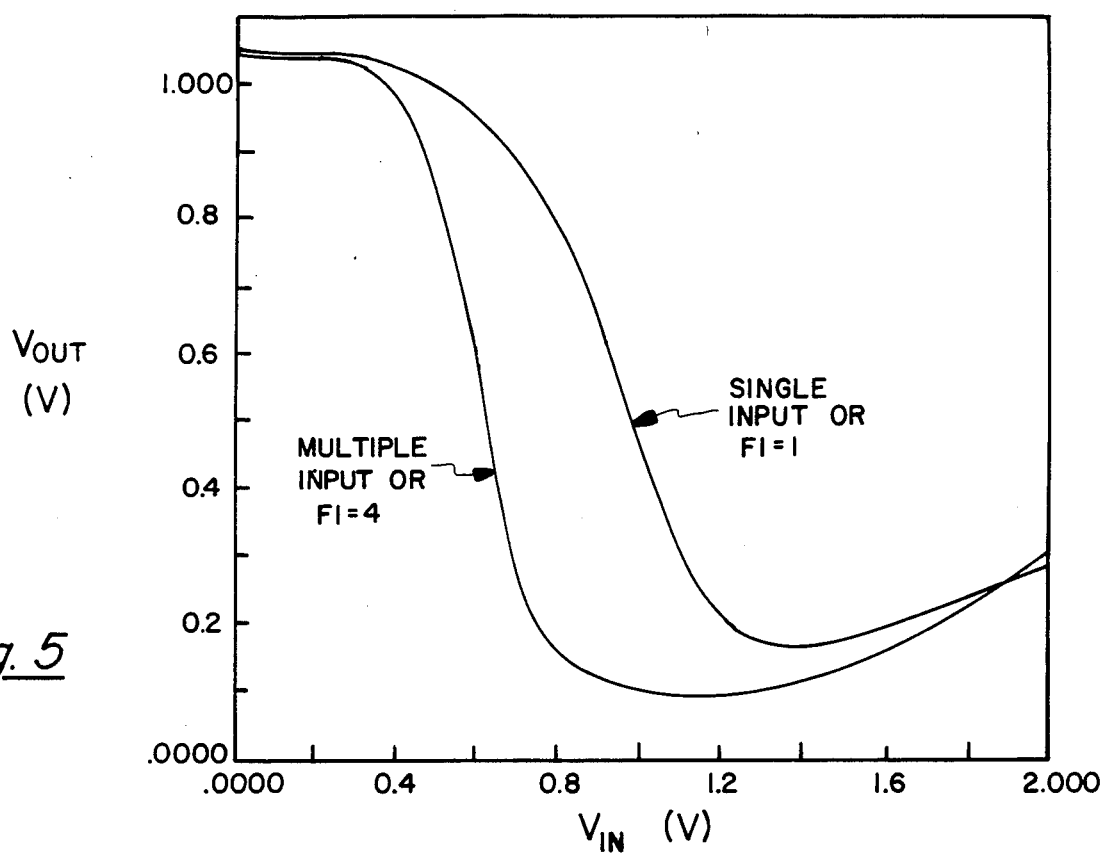
FIG. 5 shows the measured DC transfer curve of single and multiple OR inputs to the circuit of FIG. 2.

FIG. 5 shows the measured DC transfer curve of single and multiple OR inputs to circuit 42.

Figure 6:
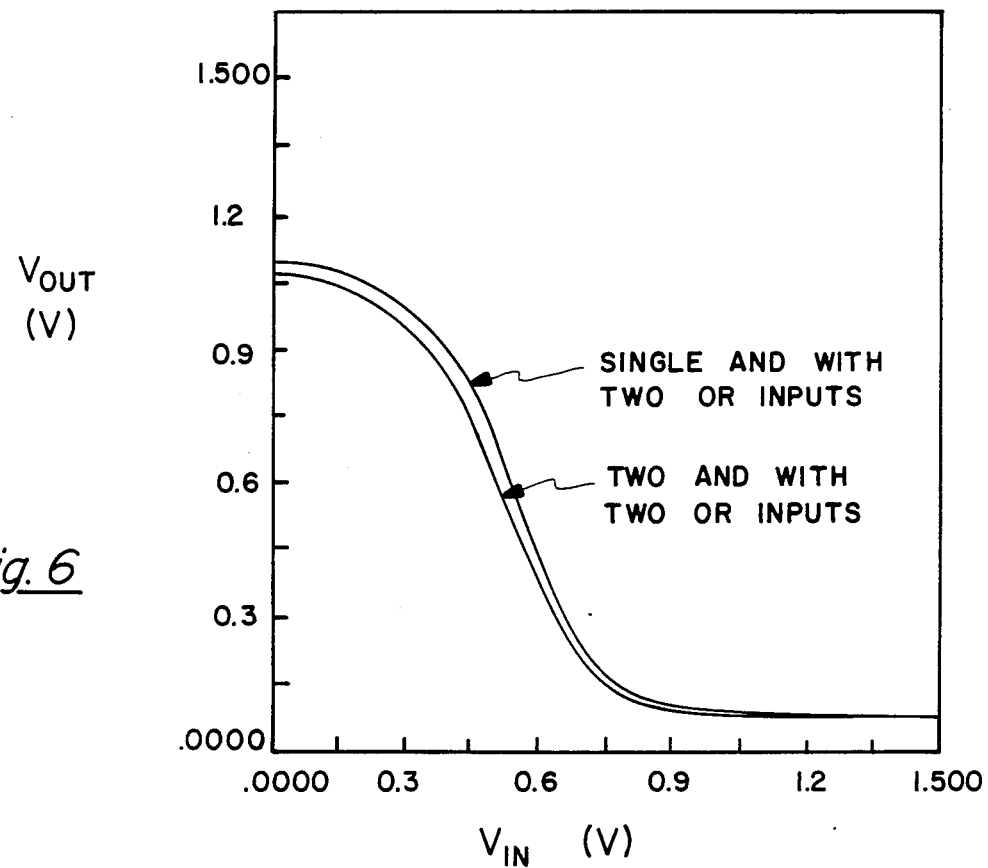
FIG. 6 shows the measured DC transfer characteristics of single and multiple AND operations in the circuit of FIG. 2.

FIG. 6 shows the measured DC transfer characteristics of single and multiple AND operations in circuit 42 with two OR inputs.

Figure 7:
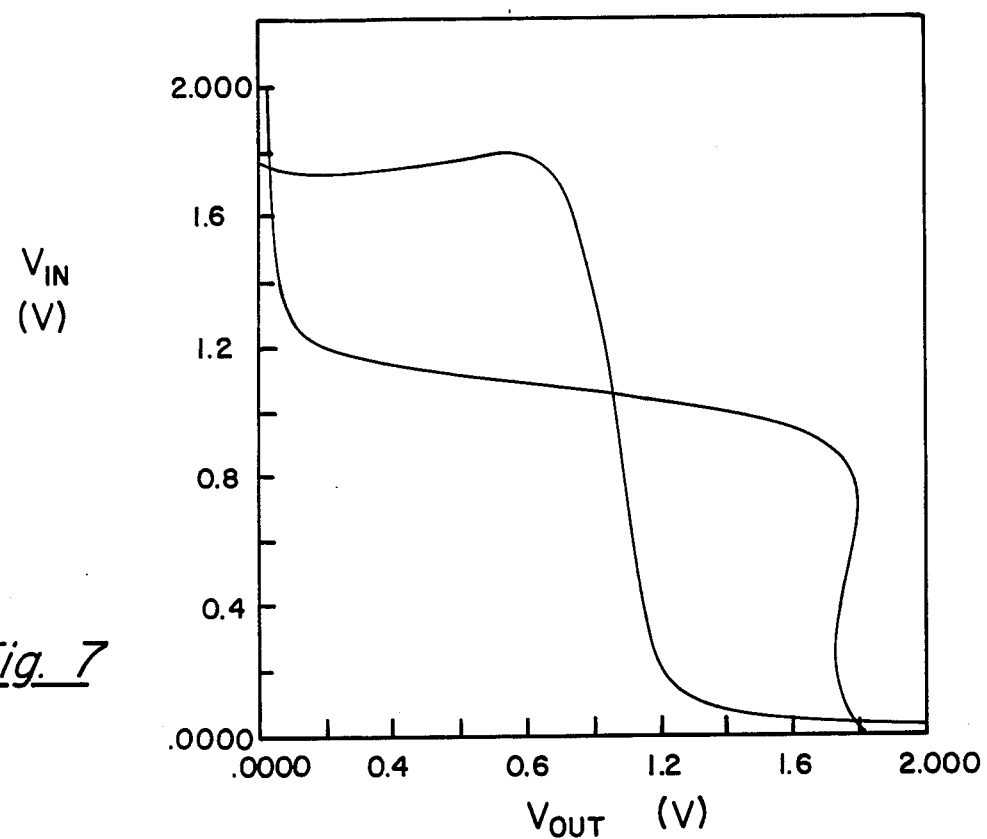
FIG. 7 shows the measured DC transfer curves of the circuit of FIG. 2 with the inverse thereof superimposed for measuring noise margin.

FIG. 7 is measured DC transfer data for the circuit of FIG. 2 with the inverse thereof superimposed for measuring noise margin.

Figure 8:
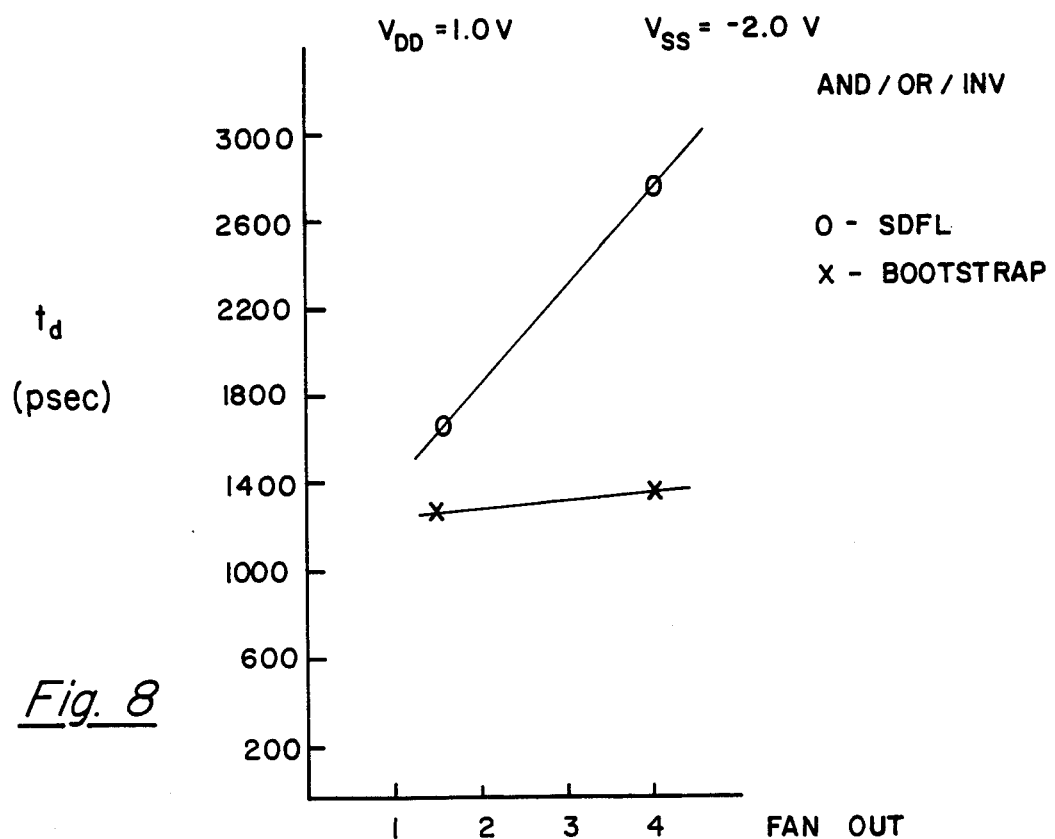
FIG. 8 shows the measured gate delay of the circuit of FIG. 2 versus fanout both with and without the bootstrap output of FIG. 2A.

FIG. 8 shows the measured gate delay of the OR/NAND circuit 42 of FIG. 2 versus fanout with and without the bootstrap technique (i.e., FIG. 2A) for low power applications.

Figure 9:
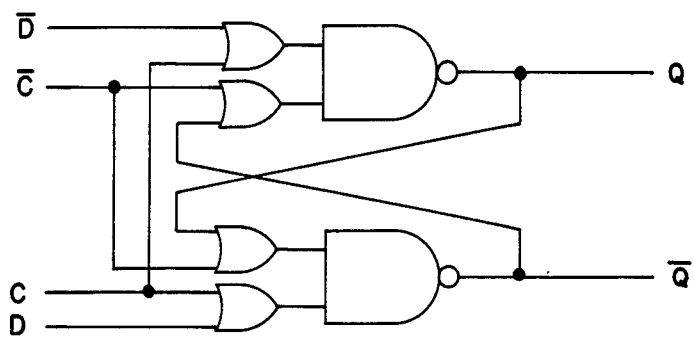
FIGS. 9 and 9A show a complementary flip-flop and its implementation using the OR/AND circuit, respectively.
Figure 9A:
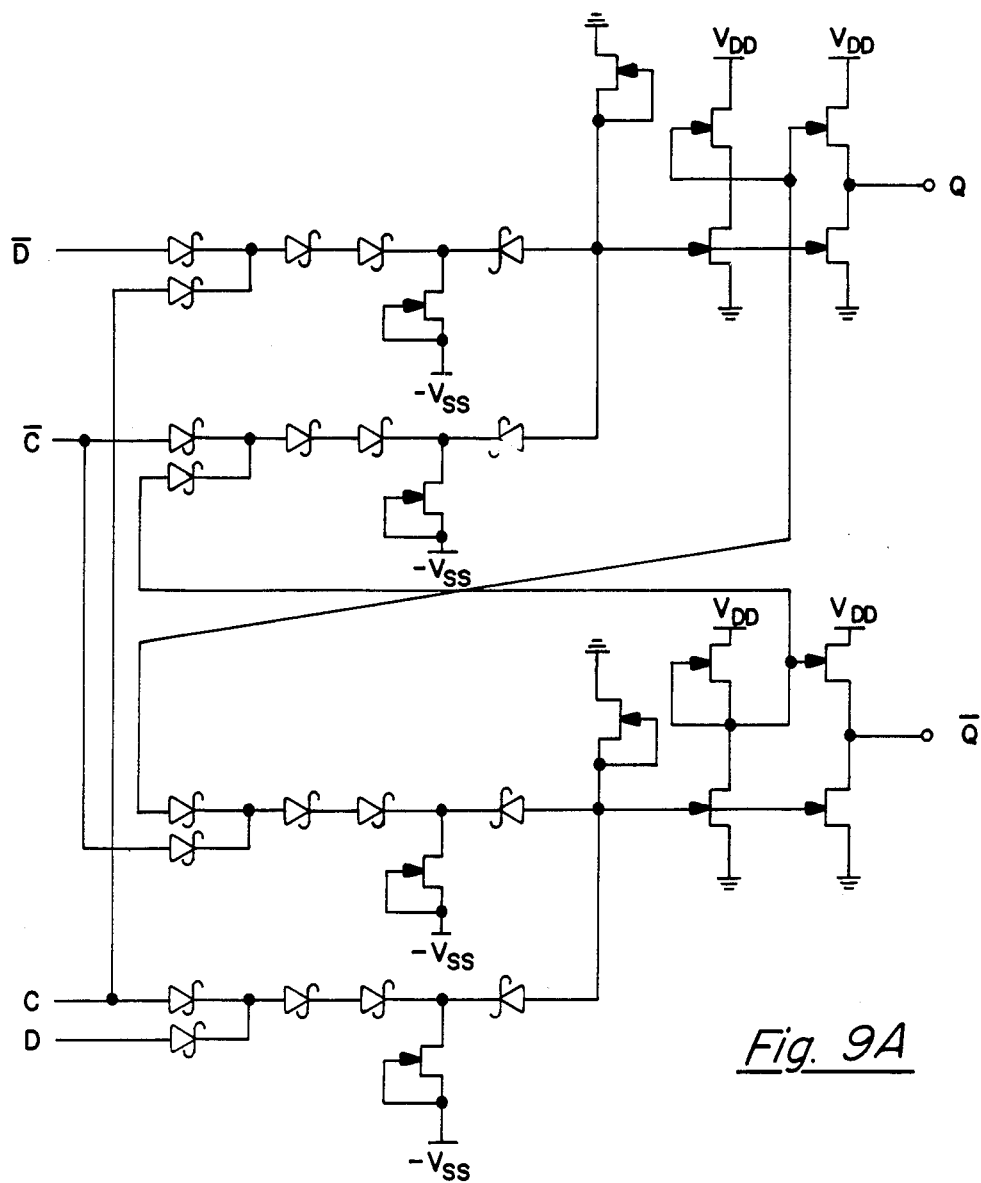

FIGS. 9 and 9A show a high speed complementary flip-flop and its implementation using circuit 42, respectively.

Table 1 shows the measured noise margin (determined by the maximum square method from FIG. 8) of five SDFL OR/NAND gates like circuit 42 fabricated on GaAs. The measured circuit was a 4 OR input NAND gate with a fanout of 2.

Table 2 summarizes measured data of an SDFL OR-/AND/INVERT circuit 42 of FIG. 2 having a single input using the device sizes shown. This data was derived using depletion mode nonself-aligned GaAs MESFETs having a $-0.9$ V threshold voltage.

TABLE 1

| 4 OR INPUT NAND GATE | 1 | 2 | 3 | 4 | 5 |
|---|---|---|---|---|---|
| $V_{DD} = 2$ V | | | | | |
| Noise Margin (mv) | 492.4 | 403.29 | 323.8 | 489.4 | 223.8 |
| Voltage Swing (V) | 1.52 | 1.58 | 1.53 | 1.56 | 1.03 |
| Yield (%) | 49.0 | 57.1 | 81.0 | 67.0 | 34.7 |
| $V_{DD} = 1.3$ V | | | | | |
| Noise Margin (mv) | 183.5 | 191.5 | 198.9 | 313.27 | 132.1 |
| Voltage Swing (V) | 1.03 | 0.948 | 0.954 | 1.06 | 0.593 |
| Yield (%) | 49.0 | 55.1 | 81.6 | 67.0 | 26.5 |

TABLE 2

| SINGLE INPUT OR/AND/INVERT SDFL WITHOUT BOOTSTRAP | | | | |
|---|---|---|---|---|
| FANOUT | 2 | 2 | 4 | 4 |
| CAPACITANCE LOADING (fF) | — | — | 217 | 217 |
| $V_{DD}$ (V) | 1.3 | 2 | 1.3 | 2 |
| $V_{SS}$ (V) | −2 | −2 | −2 | −2 |
| $I_{DD}$ (μA) | 154.4 | 171.4 | 237.3 | 492.7 |
| $I_{SS}$ (μA) | 72.7 | 83.6 | 67.2 | 69.9 |
| P (μW) | 346 | 510 | 443 | 1125 |
| $T_d$ (ns) | 1.65 | 2.27 | 1.38 | 1.10 |
| $P \times T_d$ (fJ) | 571 | 1158 | 612 | 1233 |
| $V_{SW}$ (V) | 0.34 | 0.50 | 0.7 | 0.8 |
| FANOUT | 2 | 2 | 4 | 4 |
| CAPACITANCE LOADING (fF) | — | — | 217 | 217 |
| $V_{DD}$ (V) | 1.3 | 2 | 1.3 | 2 |
| $V_{SS}$ (V) | −2 | −2 | −2 | −2 |
| $I_{DD}$ (μA) | 197.9 | 498.5 | 145.7 | 155.4 |
| $I_{SS}$ (μA) | 72.7 | 73.1 | 64.5 | 65.2 |
| P (μW) | 373 | 1143 | 304 | 441 |
| $T_d$ (ns) | 1.25 | 1.04 | 2.71 | 3.10 |
| $P \times T_d$ (fJ) | 466 | 1189 | 823 | 1365 |
| $V_{SW}$ (V) | 0.28 | 0.34 | 0.9 | 1.4 |

The present invention can be expanded to multiple logic levels of OR/AND circuits. The invention is particularly suited to very large scale integrated circuits (VLSI) which implements more logic functions in less chip area, with increased speed and lower power.

What is claimed is:

1. A multiple input circuit comprising:
   a plurality of groups of diodes, each said diode of each said group having an anode and a cathode;
   a plurality of inputs wherein each said input is connected to only one said anode;

a plurality of nodes wherein each said node is connected to all said cathodes of only one said subplurality of said diodes;
a plurality of current sinks wherein each of said current sinks is connected to only one said node of said plurality of nodes;
a plurality of diodes wherein each diode has a cathode connected to only one node of said plurality of nodes, and has an anode;
a common node connected to said anodes of said plurality of diodes;
a current source connected to said common node;
a first field effect transistor having a gate connected to said common node, having a source connected to a reference ground voltage potential and having a drain;
an output node connected to said drain of said first field effect transistor;
a second field effect transistor having a source connected to said drain of said first field effect transistor, and having a gate and a drain connected to a positive voltage source;
a first bootstrap diode having an anode connected to said drain of said second field effect transistor and having a cathode connected to said gate of said second field effect transistor; and
a second bootstrap diode having an anode connected to said gate of said second field effect transistor and having a cathode connected to said source of said second field effect transistor.

2. Apparatus of claim 1 wherein said current source comprises:
a field effect transistor having a source connected to said common node, and having a gate and a drain connected to said reference ground voltage potential;
a first bootstrap diode having an anode connected to said drain of said field effect transistor and having a cathode connected to said gate of said field effect transistor; and
a second bootstrap diode having an anode connected to said gate of said field effect transistor and having a cathode connected to said source of said field effect transistor.

3. Apparatus of claim 2 wherein each current sink of said plurality of current sinks comprises a field effect transistor having a drain connected to only one respective said node of said plurality of nodes, having a gate and having a source connected to said gate of said field effect transistor and to a negative voltage source.

4. Apparatus of claim 3 wherein each said current sink further comprises:
a first bootstrap diode having an anode connected to said drain of said field effect transistor and having a cathode connected to said gate of said field effect transistor; and
a second bootstrap diode having an anode connected to said gate of said field effect transistor, having a cathode connected to said source of said field effect transistor, and said second bootstrap diode being the only connection between said gate and said source of said field effect transistor.

5. Apparatus of claim 4 wherein said field effect transistors are selected from a group consisting of metal-semiconductor field effect transistors, metal-oxide-semiconductor field effect transistors, metal-insulator-semiconductor field effect transistors, and modulation-doped field effect transistors.

6. Apparatus of claim 4 wherein:
said diodes are Schottky diodes;
said field effect transistors are depletion mode metal-semiconductor transistors; and
said apparatus is integrated in a gallium arsenide substrate.

7. A multiple input circuit requiring only one voltage source having a ground reference comprising:
a plurality of groups of diodes, each diode of said group having an anode and a cathode;
a plurality of inputs having each input connected to one and only one said anode;
a plurality of nodes having each node connected to said cathodes of one and only one said subplurality of diodes;
a plurality of current sinks having each current sink connected to one and only one node of said plurality of nodes;
a plurality of diodes having a cathode of each diode connected to one and only one node of said plurality of nodes, and having an anode of each diode;
a common node connecting said anodes of said plurality of diodes;
a current source connected to said common node;
a first enhancement mode field effect transistor having a gate connected to said common node, having a source connected to said ground reference, and having a drain;
an output node connected to said drain of said first field effect transistor; and
a second enhancement mode field effect transistor having a source connected to said output node, and having a gate and a drain both connected to said voltage source.

8. Apparatus of claim 7 wherein said each current sink of said plurality of current sinks comprises an enhancement mode field effect transistor having a gate and a drain both connected to said one and only one node of said plurality of nodes, and having a source connected to said ground reference.

9. Apparatus of claim 8 wherein said current source comprises an enhancement mode field effect transistor having a source connected to said common node, and having a gate and a drain both connected to said voltage source.

10. A multiple input circuit functioning as a flip-flop having a one-gate delay from input to output, comprising:
a first diode having an anode connected to a first input and having a cathode;
a first node connected to said cathode of said first diode;
first voltage level shifting means, for shifting a voltage level of a signal, having an anode connected to said first node and having a cathode;
a second diode having a cathode connected to said first node and having an anode;
a third diode having an anode connected to a second input and having a cathode;
a second node connected to said cathode of said third diode;
second voltage level shifting means for shifting a voltage level of a signal, having an anode connected to said second node and having a cathode;
a fourth diode having a cathode connected to said second node and having an anode;
a fifth diode having an anode and having a cathode;

a third node connected to said cathode of said fifth diode;

third voltage level shifting means, for shifting a voltage level of a signal, having an anode, connected to said third node and having a cathode;

a sixth diode having a cathode connected to said third node and having an anode connected to said anode of said third diode;

a seventh diode having an anode connected to a third input and to said anode of said second diode, and having a cathode;

a fourth node connected to said cathode of said seventh diode;

fourth voltage level shifting means for shifting a voltage level of a signal, having an anode connected to said fourth node and having a cathode;

an eighth diode having a cathode connected to said fourth node and having an anode connected to a fourth input;

a first current sink connected to said cathode of said first voltage level shifting means;

a ninth diode having a cathode connected to said cathode of said first voltage level shifting means, and having an anode;

a fifth node connected to said anode of said ninth diode;

a second current sink connected to said cathode of said second voltage level shifting means;

a tenth diode having a cathode connected to said cathode of said second voltage level shifting means, and having an anode connected to said fifth node;

a third current sink connected to said cathode of said third voltage level shifting means;

an eleventh diode having a cathode connected to said cathode of said third voltage level shifting means, and having an anode;

a sixth node connected to said anode of said eleventh diode;

a fourth current sink connected to said cathode of said fourth voltage level shifting means;

a twelfth diode having a cathode connected to said cathode of said fourth voltage level shifting means and having an anode connected to said sixth node;

a first current source connected to said fifth node;

a second current source connected to said sixth node;

a first field effect transistor having a gate connected to said fifth node, having a source connected to a ground voltage reference, and having a drain;

a second field effect transistor having a gate connected to said gate of said first field effect transistor, having a source connected to said ground voltage reference, and having a drain connected to a first output;

a third field effect transistor having a gate connected to said drain of said first field effect transistor, having a source connected to said drain of said first field effect transistor, and having a drain connected to a positive voltage potential;

a fourth field effect transistor having a gate connected to said gate of said third field effect transistor and connected to said anode of said fifth diode, having a source connected to said drain of said second field effect transistor, and having a drain connected to said positive voltage potential;

a fifth field effect transistor having a gate connected to said sixth node, having a source connected to said ground voltage reference, and having a drain;

a sixth field effect transistor having a gate connected to said gate of said fifth field effect transistor, having a source connected to said ground voltage reference, and a drain connected to a second output;

a seventh field effect transistor having a gate connected to said drain of said fifth field effect transistor, having a source connected to said drain of said fifth field effect transistor, and having a drain connected to said positive voltage potential; and an eighth field effect transistor having a gate connected to said gate of said seventh field effect transistor and connected to said anode of said fourth diode, having a source connected to said drain of said sixth field effect transistor, and having a drain connected to said positive voltage potential.

11. Apparatus of claim 10 wherein:

said first current sink comprises a ninth field effect transistor having a drain connected to said cathode of said first voltage level shifting means, and having a gate and a source connected to a negative voltage potential;

said second current sink comprises a tenth field effect transistor having a drain connected to said cathode of said second voltage level shifting means, and having a gate and a source connected to said negative voltage potential;

said third current sink comprises an eleventh field effect transistor having a drain connected to said cathode of said third voltge level shifting means, and having a gate and a source connected to said negative voltage potential;

said fourth current sink comprises a twelfth field effect transistor having a drain connected to said cathode of said fourth voltage level shifting means, and having a gate and a source connected to said negative voltage potential;

said first current source comprises a thirteenth field effect transistor having a source and a gate connected to said fifth node, and having a drain connected to said ground voltage reference; and said second current source comprises a fourteenth field effect transistor having a source and a gate connected to said sixth node, and having a drain connected to said ground voltage reference.

12. Apparatus of claim 11 further comprising:

a twenty-first diode having an anode connected to said drain of said third field effect transistor and having a cathode connected to said gate of said third field effect transistor;

a twenty-second diode having an anode connected to said gate of said third field effect transistor, having a cathode connected to said source of said third field effect transistor, and said twenty-second diode being the only connection between said gate and said source of said third field effect transistor;

a twenty-third diode having an anode connected to said drain of said seventh field effect transistor and having a cathode connected to said gate of said seventh field effect transistor; and a twenty-fourth diode having an anode connected to said gate of said seventh field effect transistor, having a cathode connected to said source of said seventh field effect transistor, and said twenty-fourth diode being the only connection between said gate and said source of said seventh field effect transistor.

13. Apparatus of claim 12 further comprising:

a twenty-fifth diode having an anode connected to said drain of said thirteenth field effect transistor and having a cathode connected to said gate of said thirteenth field effect transistor;

a twenty-sixth diode having an anode connected to said gate of said thirteenth field effect transistor, having a cathode connected to said source of said thirteenth field effect transistor, and said twenty-sixth diode being the only connection between said gate and said source of said thirteenth field effect transistor;

a twenty-seventh diode having an anode connected to said drain of said fourteenth field effect transistor and having a cathode connected to said gate of said fourteenth field effect transistor; and a twenty-eighth diode having an anode connected to said gate of said fourteenth field effect transistor, having a cathode connected to said source of said fourteenth field effect transistor, and said twenty-eighth diode being the only connection between said gate and said source of said fourteenth field effect transistor.

14. Apparatus of claim 13 further comprising:

a twenty-ninth diode having an anode connected to said drain of said ninth field effect transistor and having a cathode connected to said gate of said ninth field effect transistor;

a thirtieth diode having an anode connected to said gate of said ninth field effect transistor, having a cathode connected to said source of said ninth field effect transistor, and said thirtieth diode being the only connection between said gate and said source of said ninth field effect transistor;

a thirty-first diode having an anode connected to said drain of said tenth field effect transistor and having a cathode connected to said gate of said tenth field effect transistor;

a thirty-second diode having an anode connected to said gate of said tenth field effect transistor, having a cathode connected to said source of said tenth field effect transistor, and said thirty-second diode being the only connection between said gate and said source of said tenth field effect transistor;

a thirty-third diode having an anode connected to said drain of said eleventh field effect transistor and having a cathode connected to said gate of said eleventh field effect transistor;

a thirty-fourth diode having an anode connected to said gate of said eleventh field effect transistor, having a cathode connected to said source of said eleventh field effect transistor, and said thirty-fourth diode being the only connection between said gate and said source of said eleventh field effect transistor;

a thirty-fifth diode having an anode connected to said drain of said twelfth field effect transistor and having a cathode connected to said gate of said twelfth field effect transistor; and a thirty-sixth diode having an anode connected to said gate of said twelfth field effect transistor, having a cathode connected to said source of said twelfth field effect transistor, and said thirty-sixth diode being the only connection between said gate and said source of said twelfth field effect transistor.

15. Apparatus of claim 14 wherein said field effect transistors are depletion mode transistors.

16. Apparatus of claim 15 wherein said field effect transistors are metal-semiconductor field effect transistors, said diodes are Schottky diodes, and said transistors and diodes are integrated in a gallium arsenide substrate.

17. Apparatus of claim 11 wherein:

said first voltage level shifting means comprises:
a thirteenth diode having an anode connected to said first node and having a cathode, and
a fourteenth diode having an anode connected to said cathode of said thirteenth diode, and having a cathode connected to said cathode of said ninth diode;

said second voltage level shifting means comprises:
a fifteenth diode having an anode connected to said second node and having a cathode, and
a sixteenth diode having an anode connected to said cathode of said fifteenth diode, and having a cathode connected to said cathode of said tenth diode;

said third voltage level shifting means comprises:
a seventeenth diode having an anode connected to said third node and having a cathode, and
an eighteenth diode having an anode connected to said cathode of said seventeenth diode, and having a cathode connected to said cathode of said eleventh diode; and said fourth voltage level shifting means comprises:
a nineteenth diode having an anode connected to said fourth node and having a cathode, and
a twentieth diode having an anode connected to said cathode of said nineteenth diode, and having a cathode connected to said cathode of said twelfth diode.

18. Apparatus of claim 11 wherein:

said first voltage level shifting means comprises a thirteenth diode having an anode connected to said first node and having a cathode connected to said cathode of said ninth diode;

said second voltage level shifting means comprises a fifteenth diode having an anode connected to said second node and having a cathode connected to said cathode of said tenth diode;

said third voltage level shifting means comprises a seventeenth diode having an anode connected to said third node and having a cathode connected to said cathode of said eleventh diode; and said fourth voltage level shifting means comprises a nineteenth diode having an anode connected to said fourth node and having a cathode connected to said cathode of said twelfth diode.

* * * * *